(12) United States Patent
Dargatz et al.

(10) Patent No.: US 12,256,643 B2
(45) Date of Patent: Mar. 18, 2025

(54) PIEZOELECTRIC BENDING ACTUATOR DRIVE FOR USE IN A MOIST ENVIRONMENT

(71) Applicant: PI Ceramic GmbH, Lederhose (DE)

(72) Inventors: Benjamin Dargatz, Jena (DE); Kevin Speer, Mörsdorf (DE); Bernd Broich, Weid (DE)

(73) Assignee: PI CERAMIC GMBH, Lederhose (DE)

( * ) Notice: Subject to any disclaimer, the term of this patent is extended or adjusted under 35 U.S.C. 154(b) by 446 days.

(21) Appl. No.: 16/349,100

(22) PCT Filed: Nov. 10, 2017

(86) PCT No.: PCT/EP2017/078958
§ 371 (c)(1),
(2) Date: May 10, 2019

(87) PCT Pub. No.: WO2018/087333
PCT Pub. Date: May 17, 2018

(65) Prior Publication Data
US 2020/0185589 A1    Jun. 11, 2020

(30) Foreign Application Priority Data

Nov. 10, 2016   (DE) ...................... 10 2016 121 587.2

(51) Int. Cl.
*H10N 30/88* (2023.01)
*H10N 30/20* (2023.01)

(52) U.S. Cl.
CPC ....... *H10N 30/883* (2023.02); *H10N 30/2047* (2023.02)

(58) Field of Classification Search
None
See application file for complete search history.

(56) References Cited

U.S. PATENT DOCUMENTS 3,963,380 A    6/1976   Thomas et al.
4,553,059 A    11/1985  Abe et al.
(Continued)

FOREIGN PATENT DOCUMENTS

CN    101283458 A    10/2008
CN    102739104 A    10/2012
(Continued)

OTHER PUBLICATIONS

International Search Report (with English translation) and Written Opinion issued in corresponding International Patent Application No. PCT/EP2017/078958, 14 pages (Feb. 21, 2018).
(Continued)

*Primary Examiner* — Erica S Lin
(74) *Attorney, Agent, or Firm* — Buchanan Ingersoll & Rooney, PC

(57) ABSTRACT

The disclosure relates to a piezoelectric drive, such as for permanently protected use in a moist environment, which includes a housing having a chamber, which chamber is hermetically sealed by at least one elastic membrane, and includes a piezoelectric drive unit in the hermetically sealed chamber for driving a drive element. The piezoelectric drive unit can include at least one piezoelectric bending actuator, which produces a bending deflection transversely to the elastic membrane when electrically activated. For example, two bending actuators can be arranged in series or parallel.

21 Claims, 5 Drawing Sheets

(56) References Cited

U.S. PATENT DOCUMENTS

| | | | |
|---|---|---|---|
| 4,731,076 A | | 3/1988 | Noon et al. |
| 5,205,819 A | | 4/1993 | Ross et al. |
| 6,071,087 A | * | 6/2000 | Jalink, Jr. ............... F04B 17/03 |
| | | | 417/322 |
| 6,074,178 A | * | 6/2000 | Bishop ................. F04B 43/088 |
| | | | 417/322 |
| 6,295,365 B1 | * | 9/2001 | Ota ........................ H04R 17/00 |
| | | | 381/67 |
| 6,869,275 B2 | * | 3/2005 | Dante .................. F04B 43/046 |
| | | | 417/322 |
| 8,848,272 B2 | | 9/2014 | Naono |
| 2004/0144242 A1 | * | 7/2004 | Perut ...................... F15B 15/19 |
| | | | 89/1.14 |
| 2004/0252936 A1 | | 12/2004 | Despont et al. |
| 2006/0027529 A1 | * | 2/2006 | Tokunaga ............. B41J 2/1626 |
| | | | 216/27 |
| 2006/0138903 A1 | | 6/2006 | Askew et al. |
| 2007/0289377 A1 | * | 12/2007 | Wagner .................. G01N 9/002 |
| | | | 73/32 A |
| 2008/0231142 A1 | | 9/2008 | Gottlieb et al. |
| 2012/0120159 A1 | * | 5/2012 | Nakao .................. B41J 2/14233 |
| | | | 347/68 |
| 2012/0198916 A1 | * | 8/2012 | Kinnell ................. G01L 9/0019 |
| | | | 73/24.06 |
| 2012/0250130 A1 | | 10/2012 | Naono |
| 2013/0020403 A1 | * | 1/2013 | Bennett ................. F04B 43/046 |
| | | | 239/102.2 |
| 2013/0294636 A1 | | 11/2013 | Cassett et al. |
| 2014/0091155 A1 | * | 4/2014 | Jordan ................ B05B 17/0607 |
| | | | 239/4 |
| 2015/0012156 A1 | * | 1/2015 | Beaufrere ................ B64C 9/00 |
| | | | 701/16 |
| 2016/0167090 A1 | | 6/2016 | Reynolds et al. |

FOREIGN PATENT DOCUMENTS

| | | |
|---|---|---|
| DE | 2848812 A1 | 5/1980 |
| DE | 69821969 T2 | 12/2004 |
| DE | 102014217798 A1 | 3/2016 |
| EP | 1158182 A1 | 11/2001 |
| WO | 9965088 A1 | 12/1999 |
| WO | 2016094416 A1 | 6/2016 |

OTHER PUBLICATIONS

Office Action issued in corresponding German Patent Application No. 102016121587.2, 8pages, (Aug. 17, 2017).

Notification of the First Office Action issued on Oct. 31, 2022, by the Chinese Patent Office in corresponding Chinese Patent Application No. 201780069759.7, and an English Translation of the Office Action. (12 pages).

Office Action issued on Oct. 7, 2022, by the German Patent Office in corresponding German Patent Application No. 10 2016 121 587.2, and an English Translation of the Office Action. (9 pages).

Office Action (Notification of the Second Office Action) issued on Apr. 15, 2023, by the Chinese Patent Office in corresponding Chinese Patent Application No. 201780069759.7, and an English Translation of the Office Action. (13 pages).

Office Action (Notification of the Third Office Action) issued on Jun. 30, 2023, by the Chinese Patent Office in corresponding Chinese Patent Application No. 201780069759.7, and an English Translation of the Office Action. (9 pages).

* cited by examiner

PIEZOELECTRIC BENDING ACTUATOR DRIVE FOR USE IN A MOIST ENVIRONMENT

The present invention relates to a piezoelectric drive, in particular for use in a moist environment and to a piezoelectric actuator, respectively, which is intended for use in an environment containing moisture or other corrosive fluids and which, in particular, executes a movement from or against other objects.

Normally, piezoelectric materials in a moist environment, e.g. an electrolytic fluid, water, fuel or air with high humidity and condensation, are hermetically sealed so as to prevent corrosion and chemical influences through a fluid on metallic or piezoceramic materials, since corrosion will usually lead to a failure of the insulation of the piezoelectric layers, if foreign material such as moisture and electrically conductive particles are deposited on the foil electrodes and the piezoelectric material. By coating the piezoelectric drive itself, corrosion cannot be avoided completely.

Piezoelectric actuators or drives for use in a moist environment, such as valves or pump devices for conveying fluid, are known from patent documents U.S. Pat. No. 4,553,059 A, EP 1 158 182 A1, U.S. Pat. No. 3,963,380 A, DE 698 21 969 T2 or U.S. Pat. No. 5,205,819 A.

U.S. Pat. No. 4,553,059 A discloses a piezoelectric drive according to the preamble of claim 1. Corrosion protection is in this case accomplished by a piezoelectric drive unit arranged in a silicone oil, which serves as a hydraulic element. However, this piezoelectric drive known from the prior art has a complex structural design and requires a considerably large installation space, in particular in the direction of action of the piezoelectric drive.

A further piezoelectric drive is known from WO 99/65 088 A1.

It is the object of the present invention to provide a compact and stable piezoelectric drive, in particular for use in a moist environment, which allows to achieve permanent protection of the piezoelectric drive unit against foreign material such as moisture and electrically conductive particles.

For achieving this object, the present invention provides a piezoelectric drive according to claim 1. The piezoelectric drive according to the present invention is provided in particular for use in a moist environment and comprises the following features: a housing having a chamber, which is hermetically sealed by an elastic membrane, a piezoelectric drive unit being arranged in the hermetically sealed chamber and adapted to be piezoelectrically deformed by electric actuation for driving a drive element, wherein the piezoelectric drive unit comprises at least one piezoelectric bending actuator generating, when electrically actuated, a bending deflection transversely to the elastic membrane. The drive unit of the drive according to the present invention has a much more compact structural design in comparison with the conventional drive and the overall height required is much smaller, in particular in the direction of action of the piezoelectric drive. With this structural design, the piezoelectric drive unit is protected permanently and reliably against contact with the foreign material such as moisture and electrically conductive particles, while the driving effect can easily be transmitted through the elastic membrane to a drive element arranged preferably outside the hermetically sealed chamber. The piezoelectric drive is optionally coupled to, or adapted to be coupled to the drive element. Hence, the drive element can constitute a component part of the drive or a supplementary or a separate component.

"Transversely" to the elastic membrane means here that the direction of the bending deflection, the direction of the working stroke or the direction of the driving force of the piezoelectric drive unit intersects the membrane, i.e. it encloses with the (undeformed) membrane an angle between 0 and 180°, preferably in the range of 45 to 135°, preferably 90°. Although it is preferred that, when a bending deflection of the bending actuator takes place, the membrane will (simultaneously) be deformed, this is not absolutely necessary. It is possible that, when a bending deflection of the bending actuator takes place, the piezoelectric drive unit will not enter into contact with the elastic membrane, e.g. if the drive unit is decoupled from the drive element. The coupling of the drive unit (e.g. within the chamber) to the drive element (e.g. outside the chamber) may then take place e.g. with elastic deformation of the membrane, so that the drive element will enter the operating region of the piezoelectric drive and, when the drive unit is electrically actuated, the drive element will be driven accordingly. The drive element may also represent/form part of the chamber.

According to the present invention, the chamber, which has the piezoelectric drive unit arranged therein, is hermetically sealed. Current solutions, such as the drive known from WO 99/65 088 A1, protect, in the best case, the piezoelectric drive unit through adhesive bonds, seals or fits against the ingress of the medium, i.e. the fluid, but normally there is no gas tightness—and thus no hermetically sealed chamber. For this reason, substances will be transported to the interior via the gaseous phase, e.g. by an adsorption of moisture in the adhesive bond or via an exchange of gas of the seals/fits, so that protection against moisture is not given.

The present invention allows a compact structural design of a piezoelectric actuator, which can be used for movement or positioning, in particular for nanopositioning, under extreme conditions, especially in moist or aqueous surroundings, with a very high elongation/movement and a high reliability and service life (due to the hermetic seal). The necessary hermetic tightness of the housing and the membrane, especially against the transport of gases, can be realized by soldering or welding.

As a result, the necessary installation space of the piezoelectric drive or actuator, in particular in the direction of action, is substantially reduced. The suitability of the piezoelectric drive "for use in moist environment" does not only mean that the chamber is hermetically sealed relative to the piezoelectric drive unit, but that the whole drive, including its individual components, is configured for use "under water" or in other fluid or corrosive media.

Terms and Definitions

Hermetic Closure and Hermetic Seal

Within the framework of the present invention, a hermetic closure and a hermetic seal, respectively, means a closure or a seal which is absolutely tight and prevents in particular an exchange of air or water.

Drive Unit

The drive unit stands for the piezoelectrically deformable unit, including all the piezoelectric actuators and actuator-side connections located inside the hermetically sealed chamber. Lines, etc. routed through a hermetically sealed line passage do, in a narrower sense, not belong to the drive unit, since they are not arranged exclusively inside the chamber.

Bending Actuators—Deflection, Deformation, Working Stroke and Driving Force

Bending actuators used in the piezoelectric drive according to the present invention comprise preferably at least one piezocontractor, which is applied to a substrate. Piezocontractors are typically flat components. Their deflection takes place transversely to the polarization direction and to the electric field. The deflection of contractors is based on the transversal piezoelectric effect, the nominal values reached being values up to approx. 20 µm. Multilayer elements offer important advantages over single-layer piezoelements as regards the technical realization: due to the larger cross-sectional area, they generate higher forces and can be operated with a lower actuation voltage. The contraction leads to tensile stresses in the piezoceramic, which may cause damage in the brittle ceramic. Hence, a pretension is recommended.

Applied to a substrate, contractors act as bending actuators. For constructing all-ceramic benders, two active piezoceramic elements are joined together and electrically actuated. If a passive substrate, e.g. made of metal or ceramic material, is used, the element in question is referred to as composite bender. The piezoceramic elements may be configured both as single layers and as multilayer elements.

Piezoelectric bending actuators operate according to the principle of thermobimetals. By coupling a planar piezocontractor with a second layer, a bending moment will be generated during the actuation and contraction of the ceramic, the bending moment converting the small transversal change in length into a large bending deflection perpendicular to the contraction. Depending on the geometry in question, conversion factors of 30 to 40 can be accomplished, but at the expense of conversion efficiency and force generation. By means of piezoelectric bending actuators, deflections of up to several millimeters can be accomplished, the response times being in the millisecond range. However, the blocking forces are comparatively low. They typically lie in the range from Millinewton to a few Newtons.

Bending actuators, which are used in the piezoelectric drive according to the present invention, preferably extend essentially in a plane (extension plane) and have preferably a circular, annular or rectangular geometry (when seen perpendicular to the extension plane). Through electric actuation, the bending actuator will be curved—depending from where it is seen and depending on the voltage applied—convexly or concavely (when seen in, or parallel to the extension plane; cf. FIGS. 4 and 5). When the bending actuator is fixed in position on both sides, its center of area undergoes the strongest deflection essentially perpendicular to its extension plane (cf. FIG. 5). It follows that the bending deflection or a working stroke and a driving force in the direction of curvature are generated transversely or perpendicularly to the extension plane of the bending actuator.

Advantageous further developments are the subject matters of the dependent claims.

It may be of advantage when the bending actuator has a circular, annular or rectangular geometry. The bending actuator is here preferably flat in an undeformed initial state and preferably oriented precisely parallel or substantially parallel to the elastic membrane and/or it generates, when electrically actuated, a bending deflection (i.e. a working stroke and/or a driving force) precisely or substantially perpendicular to the elastic membrane. When configured in this way, the drive according to the present invention will be particularly compact, especially in the direction of action of the drive, and will be able to accomplish a particularly large working stroke. The term "substantially" is intended to cover a respective deviation of +/−5% from a nominal value within the framework of the present invention.

It may prove expedient to provide the piezoelectric drive unit with two or more piezoelectric bending actuators, which are preferably arranged and/or interconnected in series such that the bending deflections (i.e. working strokes) of the piezoelectric bending actuators, which can be accomplished by electric actuation, will add up in magnitude. By using a plurality of actuators, the working stroke of a single actuator can easily be multiplied in this way.

It may, however, also be useful when the piezoelectric drive unit comprises two or more piezoelectric bending actuators, which are preferably arranged and/or interconnected in parallel such that the driving forces of the piezoelectric bending actuators, which can be accomplished by electric actuation, will add up in magnitude. By arranging parallel bending actuators in series, the advantages of a serial and of a parallel arrangement of bending actuators can be combined in the best possible way.

It may be useful when the piezoelectric drive unit comprises two bending actuators, which are coupled to each other such that, when electrically actuated, at least one of the bending actuators or both bending actuators curves/curve concavely to the respective other bending actuator, the bending actuators having preferably an identical structural design and being, at least sectionwise, coupled to each other circumferentially, preferably on sides facing away from each other, so that they are deformable symmetrically to each other by electric actuation, so as to accomplish bending deflections (i.e. working strokes) in opposite directions. According to this embodiment, the bending actuators deform concavely inwards and convexly outwards, the maximum bending deflections, working strokes and/or driving forces of the bending actuators being exactly adjusted to one another and the bending deflections and working strokes doubling in magnitude in comparison with those of a single bending actuator. This embodiment allows large bending deflections and working strokes, in particular with a compact installation space, especially in the direction of action of the piezoelectric drive. The coupling of the two bending actuators is preferably of an articulated, elastic, flexible and/or resilient nature, so as to compensate relative movements between the bending actuators and avoid force peaks.

It may, however, also be advantageous when the piezoelectric drive unit is connected to the housing and/or the elastic membrane, preferably fixedly, preferably centrally and particularly preferred by a substance-to-substance bond, e.g. by adhesive bonding, welding, potting, soldering, or in a form fit manner, e.g. by at least one spacer ring. The connection is preferably of an articulated, elastic, flexible and/or resilient nature, so as to compensate relative movements between the drive unit and the membrane and avoid force peaks.

It may also be of advantage, when the elastic membrane is connected to the housing such that a hermetic seal is formed, preferably fixedly, preferably circumferentially, particularly preferred along a line closed in itself and arranged in a plane, and particularly preferred by a substance-to-substance bond, e.g. by adhesive bonding, potting, soldering or welding. In this way, hermetic sealing of the chamber can be accomplished easily.

Furthermore, it may also be useful, when an inner side of the chamber is provided with a coating, preferably made of plastic, preferably PTFE. Sliding friction between the drive unit and the chamber can be reduced in this way.

It may also prove to be convenient, when the housing comprises a hermetically sealed line passage for routing the connections or connection lines of the piezoelectric drive unit therethrough, the line passage being preferably made of glass. The connections or connection lines may e.g. be potted or embedded into a glass plug, which is subsequently inserted into the respective line passage in an accurately fitting manner and there fixed in position, so as to hermetically seal this line passage.

It may be of advantage, when the housing comprises a flat flange and a circumferentially extending rim rising from an upper surface of the flange, the chamber being, at least sectionwise, defined by the upper surface of the flange and/or an inner side of the rim. This embodiment is particularly compact, stable and easy to mount.

In addition, it may be convenient, when the piezoelectric drive unit is adapted to be coupled to or when it is coupled, preferably in a form fit manner, to a drive element arranged outside the chamber, the drive element being preferably subjected to the maximum bending deflection of the bending actuator. This drive element may be a universal interface for other elements to be driven.

Furthermore, it may be useful, when the piezoelectric drive unit comprises two or more bending actuators generating, when electrically actuated, bending deflections in the same direction, wherein preferably two respective bending actuators are arranged adjacent to each other such that, when electrically actuated, one of the bending actuators deforms concavely and one of the bending actuators deforms convexly to the respective other bending actuator, the bending actuators having preferably an identical structural design and/or being, at least sectionwise, coupled in planar contact with each other. In the case of this embodiment, the driving and blocking forces of the bending actuators add up. Accordingly, the driving and blocking force of a piezoelectric drive unit comprising two bending actuators connected in this way will double without a substantial increase in the bending deflection in comparison with a piezoelectric drive unit comprising a single bending actuator. This embodiment allows large driving and blocking forces, in particular with a compact installation space.

It may also be of advantage when the maximum bending deflection of the piezoelectric drive unit lies, in relation to the dimension of the piezoelectric drive in the direction of the bending deflection, in a range of 10% to 30%, preferably in a range of 15% to 25%. In the case of this structural design, the ratio between the maximum bending deflection of the piezoelectric drive and the dimension of the piezoelectric drive in the direction of the bending deflection is much larger than in the case of conventional solutions. In this way, a piezoelectric drive with a substantial travel can be provided within a compact installation space.

Likewise, it may be of advantage, when the dimension of the piezoelectric drive in the direction of the bending deflection lies in a range of 1.5 mm to 20 mm, preferably in a range of 2 mm to 15 mm, preferably in a range of 5 mm to 10 mm. Piezoelectric drives having such dimensions are particularly versatile in use.

In addition, it may be useful, when the piezoelectric drive unit comprises two or more piezoelectric bending actuators, each generating, when electrically actuated, a bending deflection transversely to the same membrane or transversely to a such a membrane of their own or transversely to various such membranes, the various bending actuators generating preferably bending deflections in different, preferably parallel and/or opposite directions. Therefore, a respective membrane may be arranged on each side of the piezoelectric drive, by way of example, thus allowing a respective drive element to be coupled to both sides of the piezoelectric drive, or two or more piezoelectric drives to be coupled to one another. Likewise, two or more bending actuators of the piezoelectric drive, which are connected in parallel, may be covered by one membrane.

Other advantageous further developments of the invention result from combinations of the features disclosed in the claims, the description and the drawings.

DETAILED DESCRIPTION OF THE PREFERRED EMBODIMENTS

Figure 1:
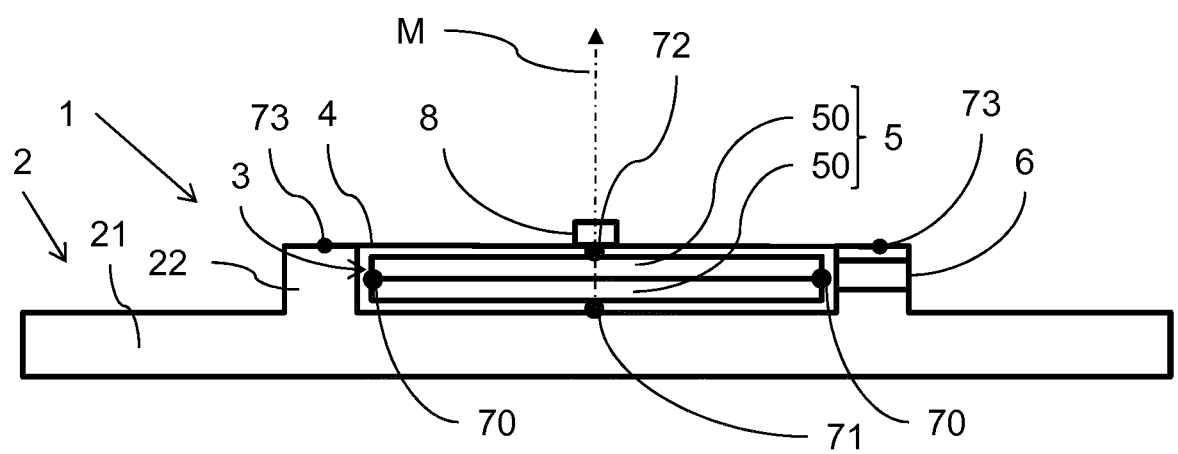
FIG. 1 shows a piezoelectric drive according to the first embodiment of the present invention, comprising a housing and a chamber hermetically sealed by an elastic membrane, a piezoelectric drive unit arranged within the chamber being in an initial state.

The device according to the present invention and its individual components will be described in detail hereinafter making reference to the enclosed drawings.

The piezoelectric drive 1 according to the first embodiment of the present invention comprises a housing 2 with a flat flange 21, on the upper surface of which a circumferential rim 22 extends perpendicular to the flange 21. Within the circumferential rim 22, a chamber 3 is formed for accommodating therein the piezoelectric drive unit 5. The chamber 3 is hermetically sealed on the upper side by a circular and elastic membrane 4.

The rigid or stiff housing 2 is made of an airtight and/or waterproof material, preferably of plastic and/or metal and/or ceramic and/or a composite material and/or glass/glass ceramic. Also the elastic membrane 4 is made of an airtight and/or waterproof material, but is elastic and made e.g. of metal, plastic, rubber, latex or a combination thereof, so that a large number of deformation cycles (>10,000) can take place over a long period of time (>10 years) without an embrittlement of the material in question. The material, the thickness and the characteristics of the housing 2 and of the membrane 4 are, according to practical considerations, preferably selected such that a durability of the piezoelectric drive 1 is ensured over the entire service life of the product to be driven.

Optionally, the piezoelectric drive unit 5 may be guided circumferentially on the inner side of the chamber 3. To this end, the inner side of the chamber 3 may be provided with a coating or lining, made e.g. of PTFE, so as to minimize the contact friction between the drive unit 5 and the chamber 3.

The piezoelectric drive unit 5 comprises two identical bending actuators 50 with a circular or annular geometry, when seen from above, which are at least sectionwise coupled to each other on the circumference and which, in a non-deformed initial state, extend in a plane (extension plane) and are adapted to be transferred to a deformation state, in which they are convexly curved outwards (FIG. 2), when electrically actuated.

Figure 3:
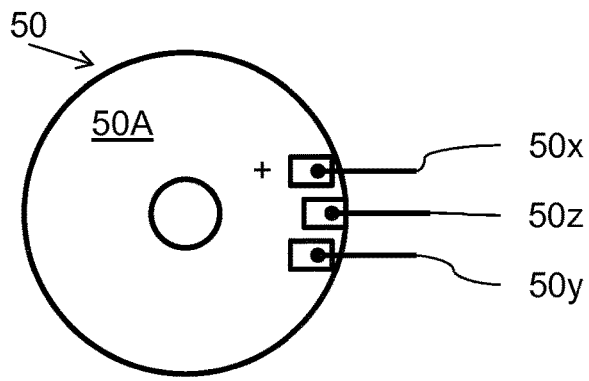
FIG. 3 shows schematic top views of various piezoelectric bending actuators with respective connections for use in the piezoelectric drive unit; view (a) shows in particular a flat bending actuator having an annular geometry, and view (b) shows a flat bending actuator having a rectangular geometry.
Figure 3:
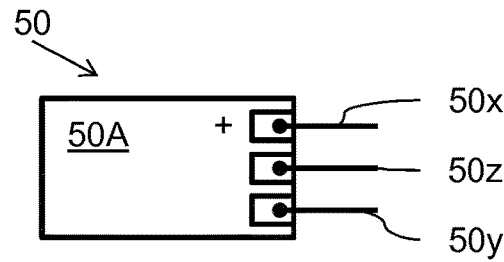

Instead of the bending actuators 50 having a circular or annular geometry, also bending actuators 50 with other geometries, in particular bending actuators 50 with a rectangular geometry, may be used. The geometries of the chamber 3 (inner circumference) and of the bending actuators 50 (outer circumference) are preferably adapted to one another. Bending actuators 50 having a circular/annular and a rectangular geometry, when seen from above, are schematically shown in representations (a) and (b) of FIG. 3.

Each piezoelectric bending actuator 50 is composed of piezoceramic layers and internal electrodes. The internal electrodes are arranged in full area in the interior of the bending actuator 50 in a plurality of layers between the piezoceramic layers and they have the shape of the outer geometry of the piezoceramic layers minus the insulation areas (circumferential edge of the annular bending actuator in view (a); transverse side of the rectangular bending actuator in view (b)) and they are connected to preferably three external electrodes (if an adhesive bond with a substrate is provided, there will only be two contacts; however, four contacts are possible as well), which are also referred to as solder connection points. When a voltage (control voltage) having the correct polarity is applied to the solder connection points via the connections and connection lines 50x, 50y, 50z, respectively, the thickness of the piezoceramic layers will increase and their length decrease. The bending moment and the working stroke as well as the resultant working force are caused by the contraction ("d31 effect").

The kind of deformation of the piezoelectric bending actuators 50 depends on the kind of fastening. In the direction of view of the respective extension plane of the bending actuator 50, the bending deflections that can be accomplished by electric actuation are shown schematically in FIGS. 4 and 5.

Figure 4:
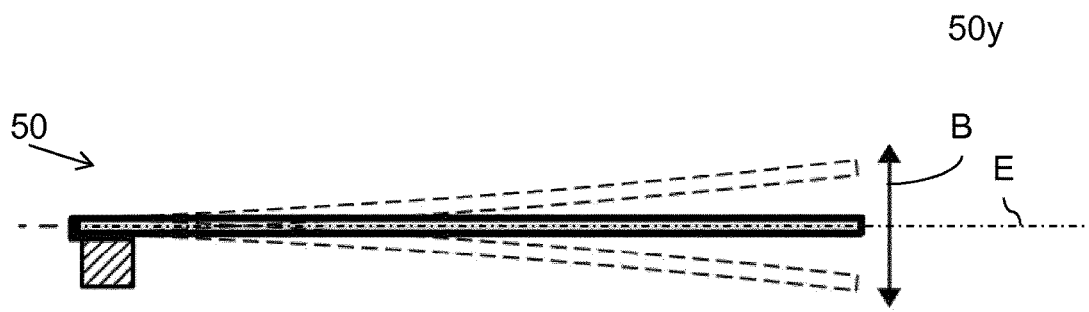
FIG. 4 shows schematically the bending deflection of a piezoelectric bending actuator, when the latter is fixed on one side thereof.

When the piezoelectric bending actuator 50 is fixed in position on one side ("cantilever"), the end of the bending actuator 50 facing away from the fixed end will be deflected farthest from the extension plane E, as shown schematically in FIG. 4.

Figure 5:
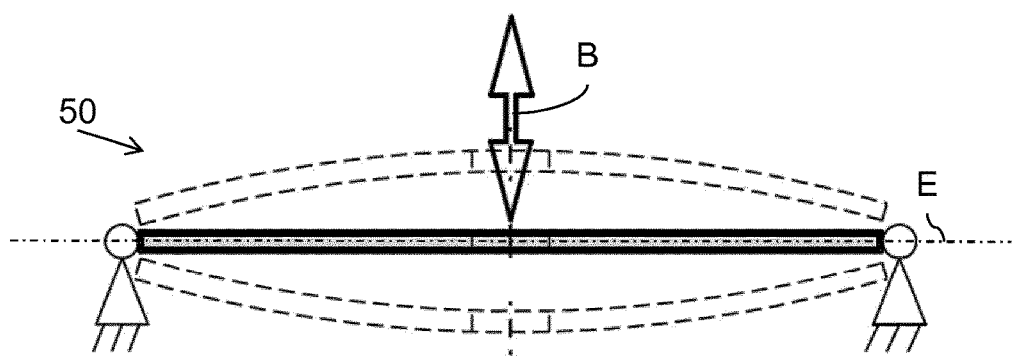
FIG. 5 shows schematically the bending deflection of a piezoelectric bending actuator, when the latter is fixed on two sides thereof with rotatable support.

When both sides are fixed in position, an area located between the fixed ends, in particular a center of area of the bending actuator 50, will undergo the highest deflection from the extension plane E, as shown schematically in FIG. 5.

As can be seen from FIGS. 4 and 5, the bending deflection B that can be accomplished by electric actuation takes place in both directions of deflection perpendicular to the extension plane E of the bending actuator 50. In the case of the reverse actuation, a drive stroke is accomplished when the electric voltage is switched off.

If a voltage (control voltage) is applied between two of the (two to four) solder connection points, e.g. via the connection lines 50x and 50z (FIG. 3), the bending actuator 50 will bend in only one direction, the active piezoceramic layers contracting in length, whereas the other layers are passive and do not undergo any change of shape.

The annular bending actuators 50 have e.g. a diameter of 25 mm, a thickness of 0.48 mm and a maximum working stroke of +/−120 μm along the central axis M. The central axes of the bending actuators 50, along which the bending deflections, working forces and working strokes are generated, coincide with the central axis M of the chamber 3.

Figure 2:
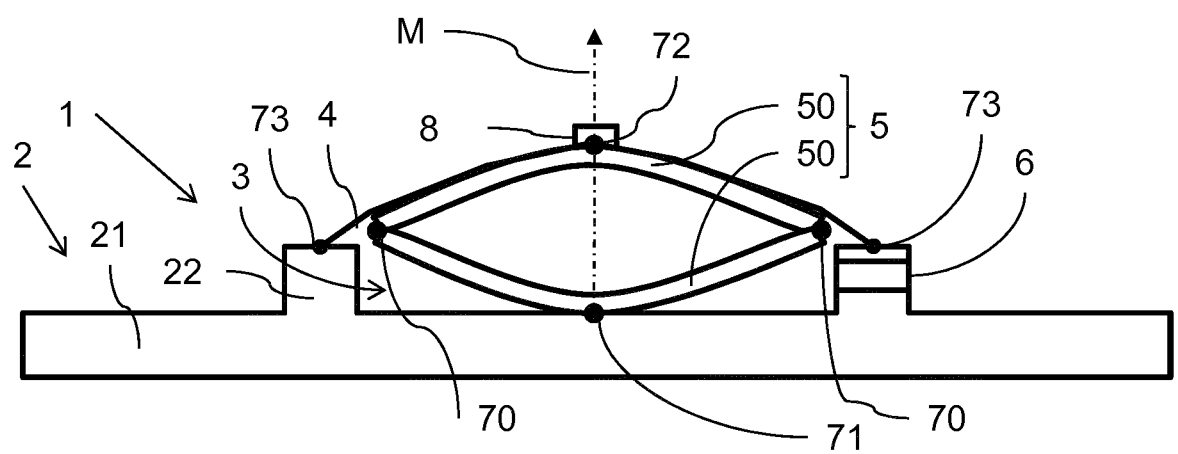
FIG. 2 shows the piezoelectric drive according to FIG. 1, the piezoelectric drive unit arranged in the chamber being in a deformation state and the elastic membrane being deformed. For illustrative purposes, the degree of deformation of the piezoelectric drive unit in the deformation state is shown in a highly exaggerated manner in comparison with the initial state.

The bending actuators 50 are arranged parallel to each other in the initial state (FIG. 1) and are articulated on one another continuously along the circumference or only at certain points on diametrically opposed sides, as schematically illustrated in FIGS. 1 and 2 by the connection points 70. Furthermore, the two bending actuators 50 extend in the undeformed initial state (FIG. 1), in which also the elastic membrane 4 is undeformed, parallel to the elastic membrane 4 as well as parallel to the bottom of the housing 2 at the lower end of the chamber 3.

The lower bending actuator 50 has its lower surface centrally connected to the bottom of the housing 2 on the lower end of the chamber 3, as schematically shown by connection point 71. The upper bending actuator 50 has its upper surface centrally connected to the elastic membrane 4, as schematically shown by connection point 72.

The bending actuators 50 are electrically and mechanically coupled to each other in such a way that they deform mirror-symmetrically to one another when electrically actuated and curve concavely relative to one another into a respective dome-shaped deformation state. In the deformation state, which is shown schematically in FIG. 2, the respective center of the bending actuator 50 is displaced upwards and downwards, respectively, from the bending-actuator extension plane defined by the circumference of the bending actuator 50. The maximum bending deflection of the center of the bending actuator 50 relative to the extension plane of the latter defines the working stroke of the bending actuator 50. By suitable actuation, the opposite bending deflections and working strokes of the serially arranged bending actuators 50 can add up in magnitude. Optionally, also only one of the bending actuators 50 may be electrically actuated, so as to curve concavely relative to the other bending actuator 50, while the other bending actuator 50 remains passively in the flat initial state without being deformed. Due to the piezoelectric deformation of the drive unit 5, the membrane 4 extending across the chamber 3 will be deformed elastically.

For illustrative purposes, the piezoelectric deformation of the piezoelectric drive unit 5 formed by the bending actuators 50 as well as the deformation of the membrane 4 are shown in a highly exaggerated manner. The actual working stroke, which can be shown by the piezoelectric drive unit 5 with two bending actuators 50 having each a diameter of 25 mm, is in the range of approx. 240 μm.

By electrically actuating the piezoelectric drive unit 5, a drive element 8, which is arranged outside the chamber 3 and which can be coupled to or is coupled to the drive unit 5, is caused to assume the undeformed state by the bending deflections of the bending actuators 50 along the central axis M, i.e. perpendicular to the direction of extension of the elastic membrane 4.

Due to the arrangement and the interconnection of the bending actuators 50 in series, the bending deflections and working strokes of the two bending actuators 50 add up in the case of electric actuation, so that they will double in comparison with those of a single bending actuator 50.

Likewise, the bending actuators 50 may be arranged and interconnected in parallel. As a result, the driving forces of the bending actuators 50 add up in the case of electric actuation. Hence, the driving force of a piezoelectric drive unit 5 with two bending actuators 50, which are connected in parallel, will double in comparison with a piezoelectric drive unit 5 with a single bending actuator 50.

For a parallel operation of the bending actuators 50, it will be of advantage to omit the connection point 71 to the flange 21. The bending actuators 50 may then be supported/fixed in position on the circumferential rim 22 of the housing 2.

A second embodiment of the present invention will be described hereinafter making reference to FIGS. 6 to 8. Elements similar to those in the first embodiment of the present invention are identified by the same reference numerals as in the first embodiment. For explaining the function of these elements, reference is made to the description of the reference numerals in connection with the first embodiment, so as to avoid repetitions.

It follows that primarily the differences existing with respect to the first embodiment will be discussed hereinafter.

Deviating from the first embodiment, the piezoelectric drive according to the second embodiment comprises a plurality of bending actuators 50, which are arranged parallel to one another. When the bending actuators 50 are arranged and interconnected in parallel, the driving forces of the bending actuators 50 add up in the case of electric actuation. Hence, the driving force of a piezoelectric drive unit 5 with two bending actuators 50, which are connected in parallel, will double in comparison with a piezoelectric drive unit 5 with a single bending actuator 50.

In the serial arrangement of the bending actuators 50 or in the parallel arrangement of the bending actuators 50, also a multiple of the bending actuators 50 may be used, so that the deflection and the working strokes and working forces will not only be doubled but multiplied.

By arranging parallel bending actuators 50 in series, the advantages of a parallel and a serial arrangement can be combined.

An appropriately modified housing 2 optionally has a through hole 23 for bending actuators 50 with or without an internal hole. This housing 2 as well as the bending actuators 50 and the internal hole may have a round or a rectangular geometry. At least two bending actuators 50 are required for the setup.

Figure 6:
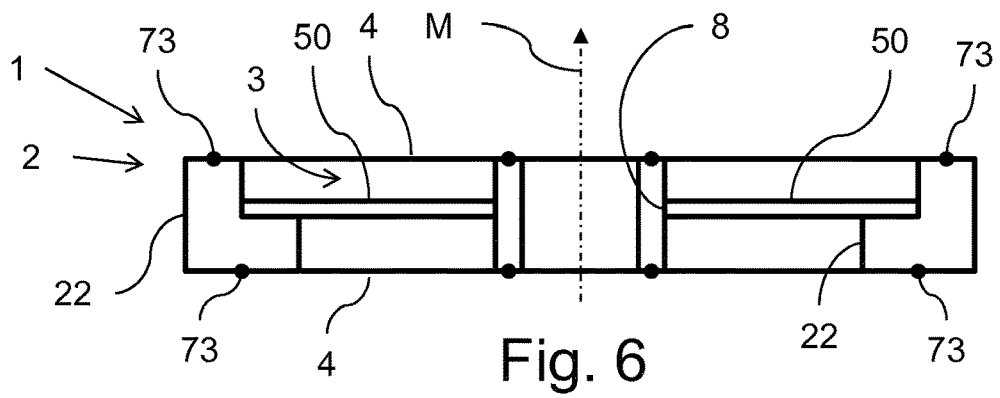
FIG. 6 shows schematically a piezoelectric drive according to the second embodiment of the present invention, comprising an annular housing and a chamber, which is hermetically sealed by two elastic membranes and in which rectangular bending actuators are arranged in a cross-shape and radially to a central drive element, the piezoelectric drive unit being in an initial state.
Figure 7:
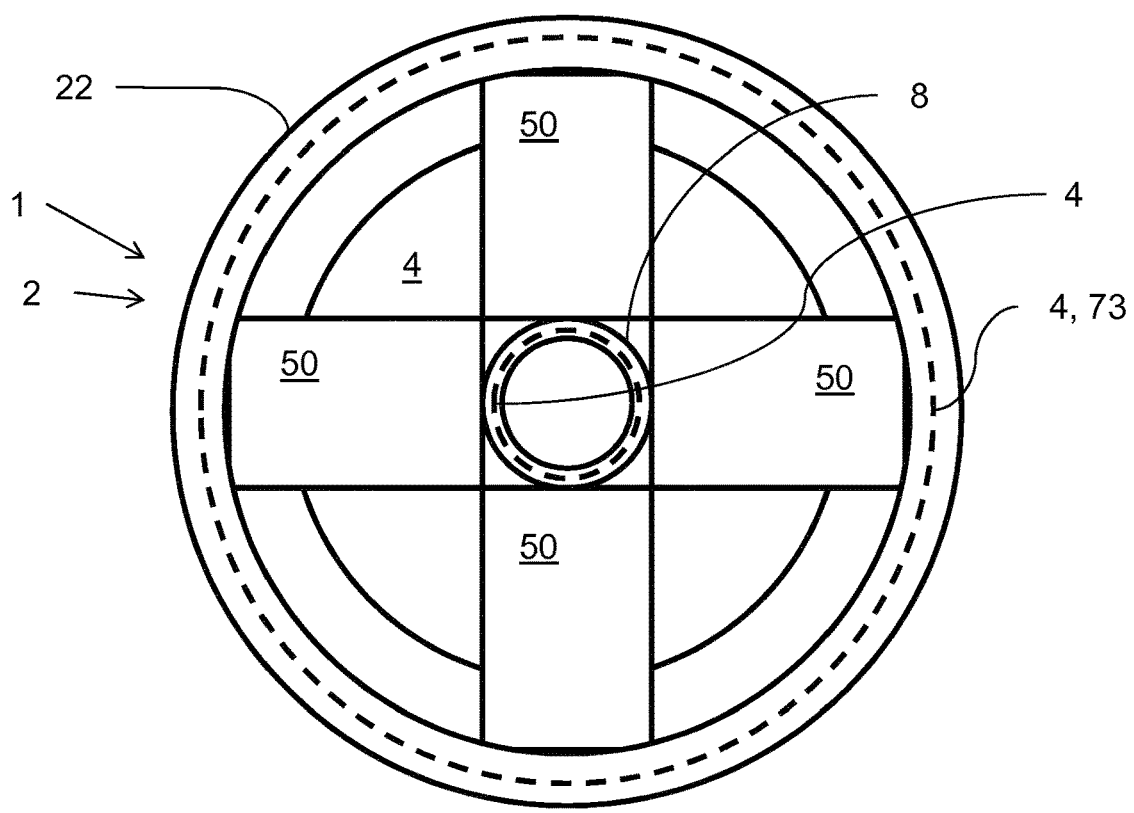
FIG. 7 shows schematically the piezoelectric drive unit according to FIG. 6 in a top view, the upper membrane being shown in a transparent representation for illustrative purposes.
Figure 8:
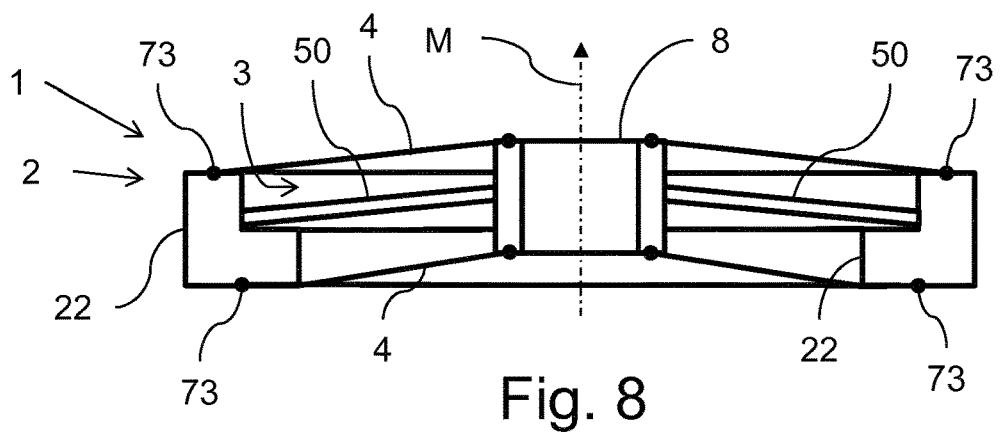
FIG. 8 shows schematically a piezoelectric drive according to the second embodiment of the present invention, the piezoelectric drive unit being in a deformation state.

The piezoelectric drive according to the second embodiment of the present invention, which is shown schematically in FIGS. 6 to 8, comprises a housing 2 with a bottom-side hole 23 and four rectangular bending actuators 50 without a hole. The total number of four bending actuators 50 are arranged in a cross-shape and radially to the central axis M of the annular housing 2 and a centrally arranged drive element 8. The housing 2 is here configured as a hollow-cylindrical component with different inner diameters. The bending actuators 50 rest with their radially outer end on an upwardly directed annular step within the circumferential rim 22 of the housing 2. Deviating from the first embodiment, the housing 2 does not comprise a flange 21. The respective radially inner end of the bending actuators 50 is fixed to the hollow-cylindrical drive element 8, preferably by a substance-to-substance bond and in a form fit manner.

The chamber 3 is defined by the annular housing 2 and the centrally arranged, cylindrical drive element 8 and is hermetically sealed at the top and at the bottom by e.g. annular membranes 4.

This embodiment facilitates the use of optical lenses, optically active materials or transparent materials, in particular in the flange 21 and/or in the membrane 4. Alternatively, the membrane/membranes 4 may be made of a transparent material (e.g. a thin sheet of glass).

In addition, the bending actuators 50 may be coated with a reflective surface for electromagnetic radiation, which can be used in particular for the case comprising the optical passages.

Figure 9:
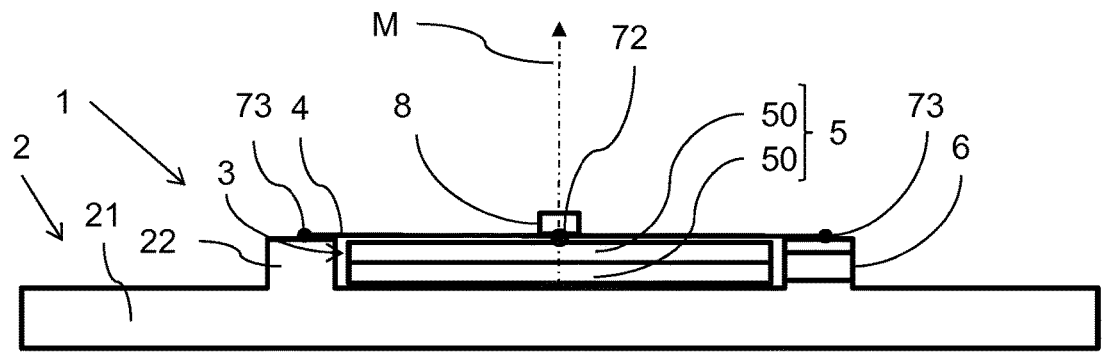
FIG. 9 shows schematically a piezoelectric drive according to the third embodiment of the present invention, comprising a housing and a chamber hermetically sealed by an elastic membrane, a piezoelectric drive unit arranged within the chamber being in an initial state.

A third embodiment of the present invention will be described hereinafter making reference to FIGS. 9 to 10. Elements similar to those in the first embodiment of the present invention are identified by the same reference numerals as in the first embodiment. For explaining the function of these elements, reference is made to the description of the reference numerals in connection with the first embodiment, so as to avoid repetitions.

The piezoelectric drive 1 according to the third embodiment differs from the first embodiment essentially insofar as the bending deflection of the bending actuators 50 takes place in the same direction in the case of electric actuation.

The identically configured bending actuators 50 are arranged parallel to each other in the initial state (FIG. 9) and are in contact with each other via a respective surface of each bending actuator. The lower bending actuator rests on the bottom of housing 2 at the lower end of the chamber 3.

Figure 10:
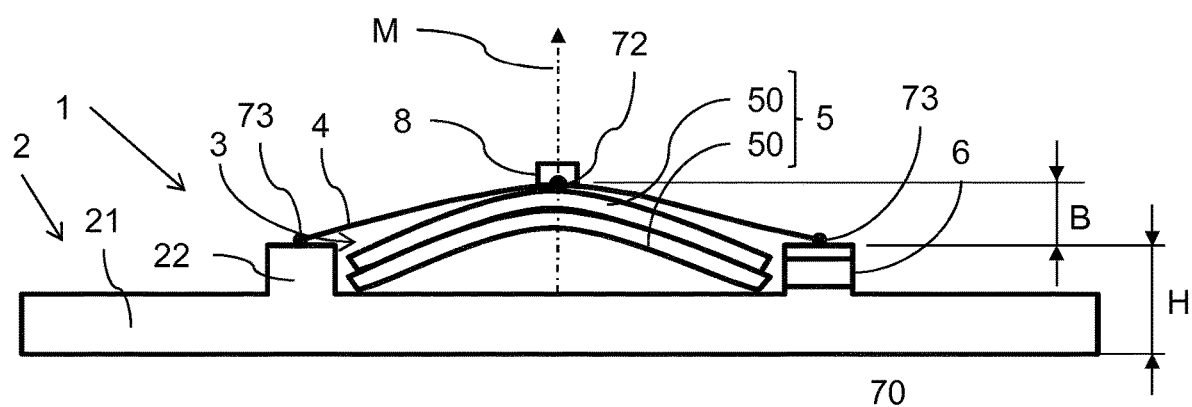
FIG. 10 shows the piezoelectric drive according to FIG. 9, wherein one bending actuator of the piezoelectric drive unit is deformed concavely and one bending actuator is deformed convexly relative to the respective other bending actuator and the elastic membrane. For illustrative purposes, the degree of deformation of the piezoelectric drive unit in the deformation state is shown in a highly exaggerated manner in comparison with the initial state.

The bending actuators are electrically and mechanically coupled to each other in such a way that, when electrically actuated, the upper bending actuator 50 deforms concavely and the lower bending actuator 50 convexly relative to the respective other bending actuator 50 (FIG. 10). As a result, the respective bending deflection of the bending actuators 50 takes place in the same direction and the driving forces of the bending actuators 50 add up in the case of electric actuation. It follows that the driving and blocking force of a piezoelectric drive unit 5 with two bending actuators 50 switched in this way will double, essentially without any increase in the bending deflection in comparison with a piezoelectric drive unit 5 with a single bending actuator 50.

The surface of the respective bending actuators 50 is of such a nature that, in the case of electric actuation, the respective contact surfaces of the bending actuators 50 can slide on one another.

According to the same principle, also more than two bending actuators 50 may be coupled to one another such that they are in planar contact with one another and each generate, when electrically actuated, a respective bending deflection in the same direction.

Figure 11:
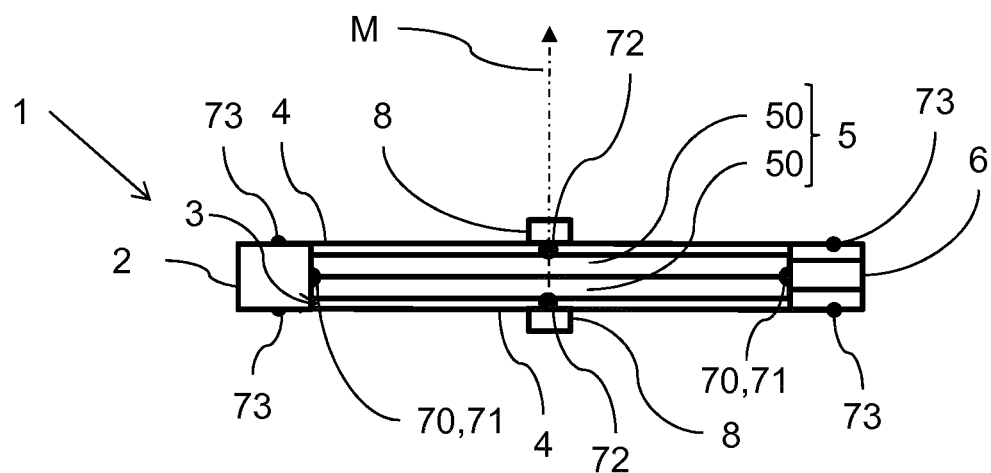
FIG. 11 shows schematically a piezoelectric drive according to the fourth embodiment of the present invention, comprising a ring as a housing and a chamber, which is hermetically sealed by two elastic membranes, a piezoelectric drive unit arranged within the chamber being in an initial state.
Figure 12:
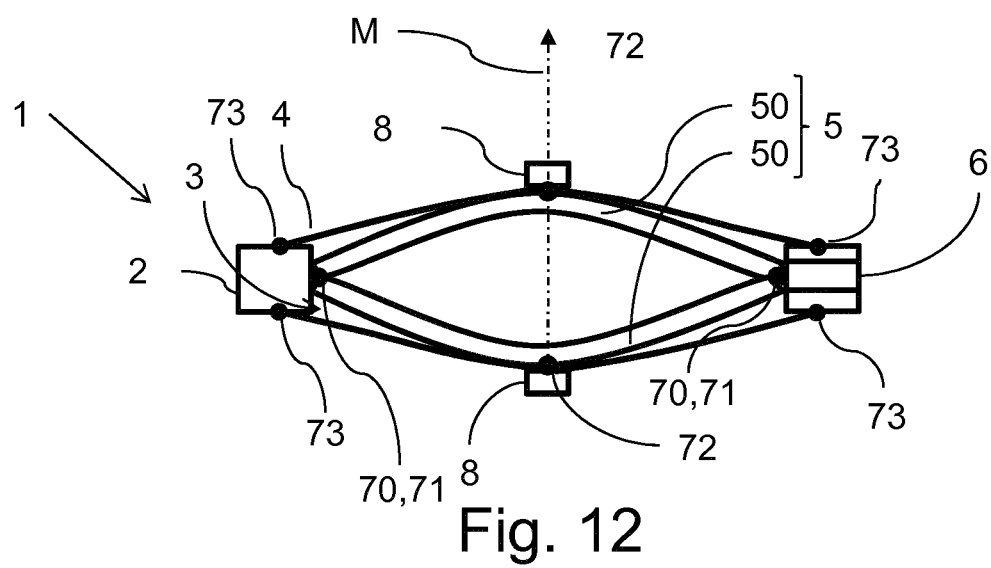
FIG. 12 shows schematically the piezoelectric drive according to FIG. 1, the piezoelectric drive unit arranged in the chamber being in a deformation state, wherein the respective bending actuators are deformed concavely relative to one another and respective elastic membranes on both sides of the piezoelectric drive are deformed. For illustrative purposes, the degree of deformation of the piezoelectric drive unit in the deformation state is shown in a highly exaggerated manner in comparison with the initial state.

A fourth embodiment of the present invention will be described hereinafter making reference to FIGS. 11 to 12. Elements similar to those in the first embodiment of the present invention are identified by the same reference numerals as in the first embodiment. For explaining the function of these elements, reference is made to the description of the reference numerals in connection with the first embodiment, so as to avoid repetitions.

The piezoelectric drive 1 according to the fourth embodiment differs from the first embodiment essentially insofar as the housing 2 is reduced to a ring and insofar as the housing 2 is closed by a respective membrane 4 on both sides.

In the initial state (FIG. 11), the bending actuators 50 are arranged parallel to each other and are articulated on each other continuously along the circumference or only at certain points on diametrically opposed sides, and fixed to the housing 2.

The bending actuators 50 are electrically and mechanically coupled to each other in such a way that they will deform mirror-symmetrically to each other, when electrically actuated, and curve concavely relative to one another into a respective dome-shaped deformation state. Through the deformation of the bending actuators 50, the upper and the lower membrane 4 are deformed in opposite directions. It follows that, according to this embodiment, a connection/coupling to a drive element on both sides of the piezoelectric drive unit can be established. According to this principle, also two or more piezoelectric drive units 5 or drives 1 can be coupled to one another in such a way that, when electrically actuated, they will generate bending deflections in different directions, e.g. in parallel directions or in opposite directions.

The above described embodiments can be combined with one another in an arbitrary manner. In particular, embodiments number 3 and 4 can be combined with one another such that two or more bending actuators 50 will generate, when electrically actuated, a bending deflection in a first direction, whereas two or more (other) bending actuators 50 will generate, when electrically actuated, a bending deflection in a second direction, the first direction being preferably opposite to the first direction.

LIST OF REFERENCE NUMERALS

1 piezoelectric drive
2 housing
3 chamber
4 elastic membrane
5 piezoelectric drive unit
6 line passage
8 drive element
21 flange
22 rim
23 through hole
50 piezoelectric actuator (bending actuator)
50A upper surface
50x positive voltage terminal
50y negative voltage terminal
50z ground
70 connection between piezoelectric actuators
71 connection between piezoelectric drive unit and housing
72 connection between piezoelectric drive unit and membrane
73 connection between membrane and housing
B bending deflection
E extension plane
H dimension of the piezoelectric drive (height) in the direction of the bending deflection
M central axis (of the piezoelectric drive unit and of the chamber)

The invention claimed is:

1. A piezoelectric drive, configured for use in a moist environment, the piezoelectric drive comprising:
a housing having a chamber, which is hermetically sealed by an elastic membrane, wherein the elastic membrane is fixedly connected to the housing such that the hermetic seal is formed; and
a piezoelectric drive unit arranged in the hermetically sealed chamber and configured to be piezoelectrically deformed by electric actuation for driving a drive element, wherein the piezoelectric drive unit includes at least one piezoelectric bending actuator, which is constituted by at least one piezocontractor applied to a substrate, for generating, when electrically actuated, a bending deflection transversely to the elastic membrane,
wherein the piezoelectric drive unit is connected to the elastic membrane and the housing, and is configured to be coupled to or is coupled, via a form fit, to the drive element arranged outside the chamber.

2. The piezoelectric drive according to claim 1, wherein the piezoelectric bending actuator has at least one of a circular, annular or rectangular geometry, the bending actuator being flat in an undeformed initial state and oriented at least substantially parallel to the elastic membrane, the bending actuator being configured for generating, when electrically actuated, a bending deflection precisely or substantially perpendicular to the elastic membrane.

3. The piezoelectric drive according to claim 1, wherein the piezoelectric drive unit comprises:
two or more piezoelectric bending actuators, which are arranged and interconnected in series such that bending deflections of the piezoelectric bending actuators, when accomplished by electric actuation, will add in magnitude.

4. The piezoelectric drive according to claim 1, wherein the piezoelectric drive unit comprises:
two or more piezoelectric bending actuators, which are arranged and interconnected in parallel such that driving forces of the piezoelectric bending actuators, when accomplished by electric actuation, will add in magnitude.

5. The piezoelectric drive according to claim 1, wherein the piezoelectric drive unit comprises:
  two bending actuators, which are coupled to each other such that, when electrically actuated, at least one of the bending actuators curve will concavely towards the other bending actuator, the bending actuators having an identical structural configuration and being, at least sectionwise, coupled to each other circumferentially, on sides facing away from each other, so that they are deformable symmetrically to each other by electric actuation, so as to generate bending deflections in opposite directions.

6. The piezoelectric drive according to claim 1, wherein the piezoelectric drive unit is connected to the elastic membrane by a connection which is fixed centrally by a material bond that is at least one of an adhesive bond, a weld, a solder, or a form fitting by at least one spacer ring.

7. The piezoelectric drive according to claim 1, wherein the elastic membrane is connected to the housing circumferentially, along a line closed in itself and arranged in a plane, by a material bond that is a bond, a weld or a solder bond.

8. The piezoelectric drive according to claim 1, wherein an inner side of the chamber is provided with a coating made of polytetrafluoroethylene PTFE.

9. The piezoelectric drive according claim 1, wherein the housing comprises:
  a hermetically sealed line passage for routing connections or connection lines of the piezoelectric drive unit therethrough, the line passage being made of glass.

10. The piezoelectric drive according to claim 1, wherein the housing comprises:
  a plane flange and a circumferentially extending rim rising from an upper surface of the flange, the chamber being, at least sectionwise, defined by at least one of an upper surface of the flange and an inner side of the rim.

11. The piezoelectric drive according to claim 1, wherein the piezoelectric drive unit comprises:
  two or more bending actuators for generating, when electrically actuated, bending deflections in a same direction, wherein two respective bending actuators are arranged adjacent to each other such that, when electrically actuated, one of the bending actuators deforms concavely and one of the bending actuators deforms convexly to the respective other bending actuator, the bending actuators having at least one of an identical structural design and being, at least sectionwise, coupled in planar contact with each other.

12. The piezoelectric drive according to claim 1, wherein a maximum bending deflection (B) of the piezoelectric drive unit lies, in relation to a dimension (H) of the piezoelectric drive in a direction of the maximum bending deflection (B), in a range of at least one of 10% to 30% or a range of 15% to 25%.

13. The piezoelectric drive according to claim 12, wherein the dimension (H) of the piezoelectric drive in the direction of the bending deflection (B) lies in a range of at least one of 1.5 mm to 20 mm, a range of 2 mm to 15 mm, or a range of 5 mm to 10 mm.

14. The piezoelectric drive according to claim 1, wherein the piezoelectric drive unit comprises:
  two or more piezoelectric bending actuators each configured for generating, when electrically actuated, a bending deflection that is at least one of transversely to a same membrane or transversely to such a membrane of their own or transversely to various such membranes, the various bending actuators being configured for generating bending deflections in different directions which are at least one of parallel or opposite directions.

15. The piezoelectric drive according to claim 2, wherein the piezoelectric drive unit comprises:
  two or more piezoelectric bending actuators, which are arranged and interconnected in series such that bending deflections of the piezoelectric bending actuators, when accomplished by electric actuation, will add in magnitude.

16. The piezoelectric drive according to claim 15, wherein the piezoelectric drive unit is connected to the elastic membrane by a connection which is fixed centrally by a material bond that is at least one of an adhesive bond, a weld, a solder, or a form fitting by at least one spacer ring.

17. The piezoelectric drive according to claim 16, wherein the elastic membrane is connected to the housing circumferentially, along a line closed in itself and arranged in a plane, by a material bond that is a bond, a weld or a solder bond.

18. The piezoelectric drive according claim 17, wherein the housing comprises:
  a hermetically sealed line passage for routing connections or connection lines of the piezoelectric drive unit therethrough, the line passage being made of glass.

19. The piezoelectric drive according to claim 18, wherein the housing comprises:
  a plane flange and a circumferentially extending rim rising from an upper surface of the flange, the chamber being, at least sectionwise, defined by at least one of an upper surface of the flange and an inner side of the rim.

20. The piezoelectric drive according to claim 1, wherein the piezoelectric drive unit is connected to the housing by a connection which is fixed centrally by a material bond that is at least one of an adhesive bond, a weld, a solder, or a form fitting by at least one spacer ring.

21. The piezoelectric drive according to claim 15, wherein the piezoelectric drive unit is connected to the housing by a connection which is fixed centrally by a material bond that is at least one of an adhesive bond, a weld, a solder, or a form fitting by at least one spacer ring.

* * * * *